United States Patent [19]

Kling

[11] 4,030,117
[45] June 14, 1977

[54] ZENER DIODE

[75] Inventor: Harry C. Kling, Boxford, Mass.

[73] Assignee: International Telephone and Telegraph Corporation, Nutley, N.J.

[22] Filed: Mar. 10, 1975

[21] Appl. No.: 557,206

[52] U.S. Cl. .................... 357/13; 357/74; 357/81

[51] Int. Cl.² .................. H01L 29/90; H01L 23/02

[58] Field of Search .................. 357/13, 74, 81

[56] References Cited

UNITED STATES PATENTS

| | | | |
|---|---|---|---|
| 3,723,835 | 3/1973 | Davis et al. | 357/13 |
| 3,735,210 | 5/1973 | Kalish et al. | 357/13 |
| 3,881,179 | 4/1975 | Howard | 357/13 |

Primary Examiner—Edward J. Wojciechowicz
Attorney, Agent, or Firm—John T. O'Halloran; Peter C. Van Der Sluys

[57] ABSTRACT

A zener diode adapted for mounting in a double plug package has a shallow junction region formed by a controlled diffusion of a first type of semiconductivity impurity into a semiconductive material having a second type of semiconductivity to establish a desired zener voltage. A region of deep diffusion of first type of semiconductivity impurity is formed adjacent to and in contact with the shallow junction region and a metal contact is connected to the deep diffused region.

11 Claims, 11 Drawing Figures

ZENER DIODE

BACKGROUND OF THE INVENTION

1. Field of the Invention

The present invention relates to zener diodes and more particularly to zener diodes adapted for mounting in a double plug package.

2. Description of the Prior Art

In semiconductor devices especially discrete devices such as diodes and transistors, a substantial portion of the cost of the device is attributable to packaging. Therefore, in the semiconductor art, there is a need for inexpensive packages that may be assembled in a minimum amount of time and preferably with automated assembly equipment.

The double plug package has been particularly useful for packaging diodes since it is inexpensive and subject to automated assembly while providing a hermetic seal; however, difficulty has been experienced with zener diodes in double plug packages.

Heretofore, one contact element of a zener diode was positioned directly over the shallow junction region which resulted in an unacceptable number of rejected devices resulting from shorted junctions. When the metallic contact was placed directly over the shallow junction region, alloying of the metal contact into the semiconductive material would take place during the high temperature sealing operation required of double plug packages. Said alloying caused contamination of the shallow junction region which resulted in high leakage and shorts.

It has also been discovered that alloying was not the only problem resulting from the formation of a contact directly to the shallow junction region. The manufacturing yield for high voltage zener diodes was also poor and on such devices the junction depth is sufficient so that alloying does not create a short. It was determined that surface imperfections between the contact and the silicon material caused the contact to make lower resistance contact to the silicon at certain points and as a result, high current density or current crowding would occur at these points causing avalanching and premature breakdown of the junction. It was also discovered that the pressure exerted on the silicon material during packaging of the zener diode in the double plug package had an adverse effect on the shallow junction, resulting in poor yields and unpredictable diode characteristics.

Thus, the double plug package which required sealing at a temperature of at least 680° C was not adaptable for use with low voltage zener diodes and also experienced poor yields when used for packaging higher voltage zener diodes.

SUMMARY OF THE INVENTION

The present invention contemplates a zener diode that is particularly adapted for mounting in a double plug package. The problems experienced in the prior art devices are eliminated by providing a deep diffused region adjacent to and in contact with the shallow junction region with a metal contact made to the deep diffused region. The alloying of metal into the semiconductive material during the sealing process is not detrimental since the alloying takes place only in the deep diffused region.

By positioning the contact over the deep diffused region, the premature breakdown caused by surface imperfections is eliminated since avalanching does not as readily occur in this region where the junction is substantially deeper and the breakdown voltage higher than in the shallow junction regions. It was also determined that by contacting the deep diffused region over its entire length, the current was more advantageously distributed so as to prevent high current density and the tendency towards avalanche at high current density points. The pressure exerted on the contact during double plug packaging is not as detrimental to the diode device when the contact is made to the deep diffused region rather than the shallow junction region and the pressure is spread out over a larger contact area.

Thus, the present invention provides a zener diode having a shallow junction region formed by a controlled diffusion to establish a desired zener voltage and a deep diffused region to which contact is made.

The primary objective of the present invention is to provide a zener diode that may be mounted in an inexpensive double plug package.

Another objective of the present invention is to provide a zener diode that may be manufactured with a higher yield than those of the prior art.

Another objective of the present invention is to provide a more reliable zener diode.

The above-mentioned and other features and objects of this invention will become more apparent by reference to the following description taken in conjunction with the accompanying drawings.

DESCRIPTION OF THE PREFERRED EMBODIMENT

Figure 1:
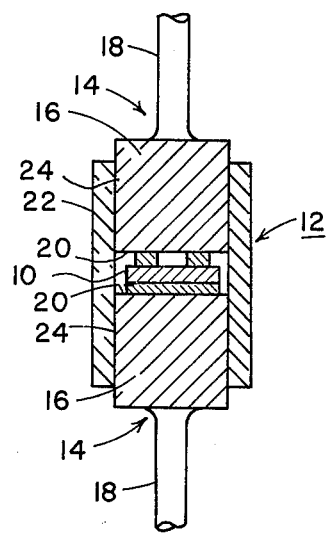
FIG. 1 is a vertical section of a double plug package having a zener diode mounted therein.

Referring to FIG. 1, there is shown a zener diode 10 mounted in a typical double plug package 12. The double plug package includes two identical axially aligned and opposed electrodes 14 each comprising a sealing plug 16 and an axially extending lead 18 welded thereto. The axially extending leads 18 are preferably formed of a copper-iron composition such as a material known commercially as Silgrid. The sealing plugs 16 are formed of a material that may be hermetically sealed to glass. A preferred material for plugs 16 is a copper covered nickel-iron core material known commercially as Dumet. The axially extending leads 18 are welded to the sealing plugs 16 so as to make electrical contact therewith.

The zener diode 10 is disposed between opposed contact faces 20 of the sealing plugs 16 to make electrical contact therewith. The sealing plugs 26 and the zener diode 10 are surrounded by a cylindrical casing 22 of glass which is hermetically sealed to cylindrical surfaces 24 of plugs 16. The casing 22 may be made of glass, ceramic or other known porous insulating material but are preferably made of a glass having a working point of less than 1,000° C and a softening point of approximately 680° C such as Corning 0102 glass or Kimble KG12 glass.

Figure 3A:
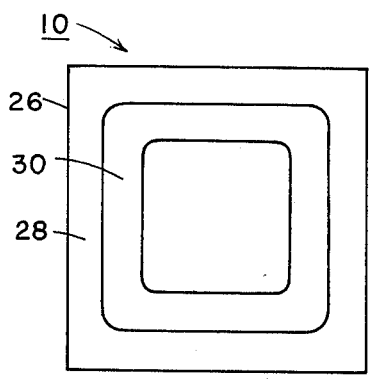
FIGS. 3A and 3B are plan views of a diode showing different stages during its manufacture.

Referring to FIGS. 2 and 3, there is shown zener diode 10 at various stages during manufacture. In FIG. 2A, there is shown a section of semiconductive material 26 such as silicon which may be either of N or P type semiconductivity. For purposes of this description, it will be assumed that material 26 is of N type conductivity. The material 26 is diffused with phosphorous to provide an impurity concentration of $10^{18} - 10^{21}$ atoms per ccm and an oxide layer 28 is formed over the material 26. In FIG. 2B, a selected portion 30 of the oxide layer 28 is removed using standard photoresist and etching techniques. FIG. 3A shows a plan view of the device wherein the portion 30 is formed in a continuous doughnut shape and has a width of approximately 70 microns. The exposed material 26 is then subjected to a boron diffusion for a period of 2 to 4 hours at an impurity concentraton of $10^{18} - 10^{21+}$ atoms per ccm to develop a deep diffused guard ring 32 of P type impurity and a resistivity of 3 ohm cm as shown in FIG. 2B.

The encircled portion of the oxide layer 28 is removed to expose the portion of semiconductive material 26 encircled by the guard ring 32.

Figure 2A:
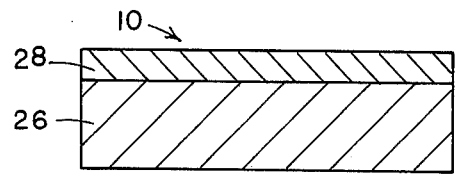
FIGS. 2A through 2H are vertical sections of a zener diode showing the diode at various stages during its manufacture.
Figure 2B:
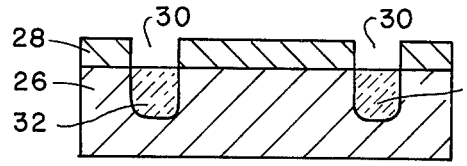
Figure 2C:
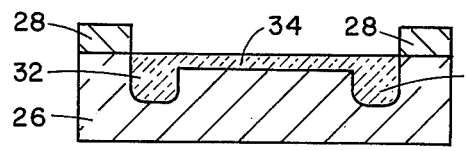
Figure 2D:
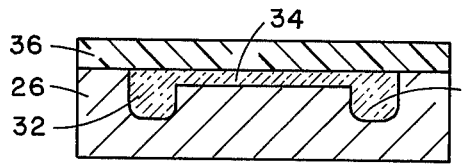

The material 26 is then subjected to a boron diffusion having an impurity concentration of $10^{18} - 10^{21+}$ atoms per ccm for a period of approximately 15 to 30 minutes to establish a shallow junction region 34 as shown in FIG. 2C. The depth of the shallow junction region determines the zener voltage for the zener diode and therefore this region should not be disturbed during subsequent processing of the diode. In order to protect the region 34, the entire surface of the diode is coated with an oxide layer 36 as shown in FIG. 2D. The oxide layer should be deposited rather than thermally grown so as not to disturb the junction region 34. The oxide layer 36 may be formed by depositing silane in an oxygen environment or may be formed by sputtering $SiO_2$ a thickness of 5,000 to 10,000 A.

Figure 3B:
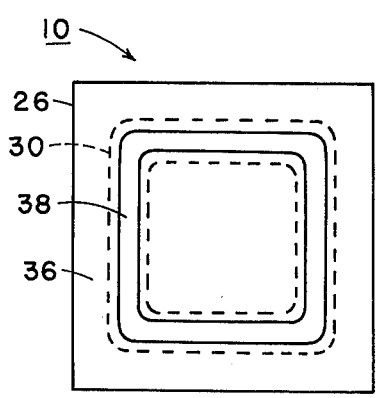
Figure 2E:
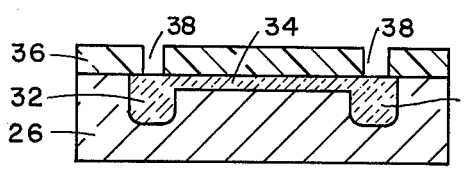

After formation of the oxide layer 36, a region 38 of the oxide is removed as shown in FIGS. 2E and 3B using standard photoresist and etching techniques. Region 38 has a configuration similar to portion 30 and is positioned over and centered within portion 30. Region 38 has a width of approximately 37.5 microns so that the opening in the oxide 36 is positioned over and centered on guard ring 32.

Figure 2F:
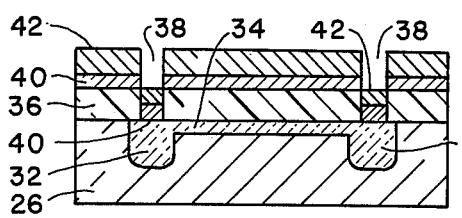

The surface of the diode is then metallized with palladium by using vacuum evaporation or sputtering techniques to form a layer of palladium 40 having a thickness of approximately 1,000 A. Silver is thereafter evaporated over the surface to form a layer 42 having a thickness of approximately 10,000 A as shown in FIG. 2F.

Figure 2G:
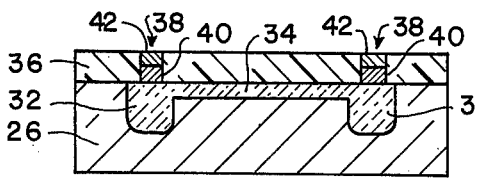

Since the palladium does not adhere to the silicon dioxide, the palladium and silver layers may be removed from the oxide layer 36 by scrubbing the surface of the diode so that the palladium and silver layers 40 and 42 remain only in region 38, as shown in FIG. 2G, where the palladium adheres to the semiconductive material 26.

It is to be understood that layers 40 and 42 in regions 38 could be formed using other standard processes well known in the semiconductor art. Silver could be evaporated over the entire surface and etched away leaving only the portion in regions 38. Another method of forming layer 40 would be to deposit a layer of platinum over the surface of the diode 10 which forms a compound with the exposed semiconductor material 26 which compound is insoluable in aqua-regia which is used to remove the remaining platinum after which additional metal layers may be formed on regions 38.

Figure 2H:
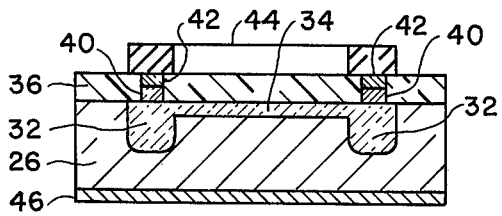

A metal contact 44 is thereafter formed over region 38 preferably using a plating technique to develop a silver contact having a height of approximately 1.5 mils above the surface of diode 10 as shown in FIG. 2H. A contact 46 is then formed on the back surface of zener diode 10. Said contact may be formed of any of a variety of standard contact metal such as nickel, aluminum, gold, silver or tin using standard techniques well known in the art.

It is to be understood that while the above description used a P type diffusion into an N type material, the present invention clearly covers the use of an N type diffusion into a P type material so that both NP or PN junctions may be formed using the present invention. The invention has also been described as having an enclosed doughnut shaped guard ring and contact; however, it is to be understood that the deep diffusion may be formed using any desired configuration whether it be square, round, zig-zagged or interleaved so long as it makes contact with the shallow junction region.

Thus, the present invention provides a low voltage zener diode that is readily adaptable for packaging in a standard double plug package. By uniquely forming metal contacts only to deep diffused regions rather than to the shallow junction region, the difficulties encountered in the prior art resulting from the alloying of metal into the shallow junction region are avoided. The invention provides a more reliable device by eliminating many of the shorts that previously resulted from the alloying of metal during the high temperature package sealing step. The present invention provides a low cost zener diode in a double plug package.

What is claimed is:

1. A zener diode comprising:
   a body of semiconductive material having a first type of semiconductivity and opposed front and back surfaces;
   a shallow junction region of a second type of semiconductivity formed in one surface of said body in pn-junction forming relation with said body;
   a deep diffused region of a second type of semiconductivity formed in said one surface in contact with and about the entire periphery of the shallow junction region;
   an insulating layer formed over said regions;
   a metal contact means extending through the insulating layer and connected to and formed on the deep diffused region over the entire length of the region;
   an electrical contact means formed on the other of said surfaces of the body of semiconductive material opposite from the one surface in which the shallow and deep diffused regions are formed;
   first and second axially aligned electrodes disposed on opposite sides of said body of semiconductive material and in electrical contact with the previously mentioned contact means; and
   a cylindrical sleeve of non-porous encapsulating material disposed about said electrodes and sealed thereto for encasing the body of semiconductive material.

2. A zener diode as described in claim 1, wherein the cylindrical sleeve is formed of glass.

3. A zener diode as described in claim 1, additionally comprising leads electrically connected to said electrodes and extending axially therefrom.

4. A zener diode as described in claim 1, wherein the metal contact includes silver and extends upwardly above the surface of the insulating layer.

5. A zener diode as described in claim 1, wherein the shallow junction region and the deep diffused region have substantially the same surface impurity concentrations.

6. A zener diode adapted for use in a double plug glass sealed axial package, said zener diode comprising:
- a body of semiconductive material having a first type of semiconductivity, said body having opposed front and back surfaces;
- an electrical contact connected to the back surface of said body;
- a shallow region of second type of semiconductivity formed in the front surface of said body opposite said electrical contact and in pn-junction forming relation with the first type of semiconductivity of the body;
- a deep diffused region of second type of semiconductivity formed in the front surface of said body in contact with and about the entire periphery of the shallow region; and
- an electrical contact connected to and formed on said deep diffused region over the entire length thereof and about the entire periphery of the shallow junction.

7. A zener diode as described in claim 6, wherein the shallow region and the deep diffused region have substantially the same surface impurity concentrations.

8. A zener diode as described in claim 6, additionally comprising an insulating layer formed over said shallow region and said deep diffused region, said contact extending through an annular opening in said insulating layer to contact the deep diffused region.

9. A low voltage zener diode as described in claim 8, wherein the contact is formed of silver and extends upwardly above the surface of the insulating layer.

10. A low voltage zener diode as described in claim 9, additionally comprising a layer of palladium disposed between said silver contact and the deep diffused region.

11. A zener diode comprising:
- a body of semiconductive material having an N-type impurity concentration and opposed front and back surfaces;
- a shallow junction region having a P-type impurity concentration formed in one surface of said body in pn-junction forming relationship with said body;
- a deep diffused region of P-type impurity formed in said one surface in contact with the entire periphery of the shallow junction region, the surface impurity concentration of the shallow junction region and the deep diffused region being substantially the same;
- an insulating layer formed over said regions;
- a metal contact means extending through the insulating layer and connnected to and formed on the deep diffused region over the entire length of said deep diffused region; and
- electrical contact means formed on the other of said surfaces of the body of semiconductor material opposite from the said one surface in which the shallow and deep diffused regions are formed.

* * * * *